United States Patent
Rodenbeck et al.

(10) Patent No.: US 6,406,938 B2
(45) Date of Patent: Jun. 18, 2002

(54) SEMICONDUCTOR AND FLIP CHIP PACKAGES AND METHOD HAVING A BACK-SIDE CONNECTION

(75) Inventors: Lloyd R. Rodenbeck; Donald R. Potter, both of Round Rock, TX (US)

(73) Assignee: Minco Technology Labs, Inc., Austin, TX (US)

( * ) Notice: Subject to any disclaimer, the term of this patent is extended or adjusted under 35 U.S.C. 154(b) by 0 days.

(21) Appl. No.: 09/739,071

(22) Filed: Dec. 18, 2000

Related U.S. Application Data

(62) Division of application No. 09/065,677, filed on Apr. 23, 1998, now Pat. No. 6,191,487.

(51) Int. Cl.[7] ............................................. H01L 21/44
(52) U.S. Cl. ..................... 438/108; 438/124; 438/118; 438/127
(58) Field of Search ................................. 438/118, 119, 438/108, 113, 121, 124, 125, 126, 127

(56) References Cited

U.S. PATENT DOCUMENTS

| | | | |
|---|---|---|---|
| 4,912,545 A | 3/1990 | Go | 357/67 |
| 5,394,303 A | * 2/1995 | Yamaji | 257/777 |
| 5,406,701 A | 4/1995 | Pepe et al. | 29/840 |
| 5,432,729 A | 7/1995 | Carson et al. | 365/63 |
| 5,569,880 A | 10/1996 | Galvagni et al. | |
| 5,657,206 A | 8/1997 | Pedersen et al. | 361/772 |
| 5,737,191 A | 4/1998 | Horiuchi et al. | |
| 5,869,886 A | * 2/1999 | Tokuno | 257/678 |
| 5,982,018 A | * 11/1999 | Wark et al. | 257/532 |
| 6,002,163 A | * 12/1999 | Wojnarowski | 257/620 |
| 6,144,101 A | * 11/2000 | Akram | 257/778 |

* cited by examiner

Primary Examiner—Kevin M. Picardat
(74) Attorney, Agent, or Firm—Gray Cary Ware & Freidenrich, LLP

(57) ABSTRACT

A semiconductor chip package having a back side connection and method of manufacture. The semiconductor chip package can combine industry standard die having conductive back sides with flip chip bump bonding to provide discrete and integrated devices that require less space on a printed circuit board. The chip packages can include a die connected by front side bond pads to a substrate. The substrate includes terminals opposite the side facing the die that electrically connect to contact pads on the opposite side of the substrate by way of vias. In one embodiment, the vias are buried in the substrate. The substrate contact pads connect to bond pads on the front side of the die. The back side of the die is electrically connected to a bond pad (and thereby to the terminal through the via) using a conductive substance that can cascade from the back side of the die to the bond pad. Solder balls can be attached to the terminals to provide solder connections to a printed circuit board. An insulating coating can be applied to the die between the conductive substance and the edge of the die along which the conductive substance cascades. In an alternative embodiment, the substrate is eliminated and the conductive substance directly connects the die back side to a printed circuit board.

20 Claims, 3 Drawing Sheets

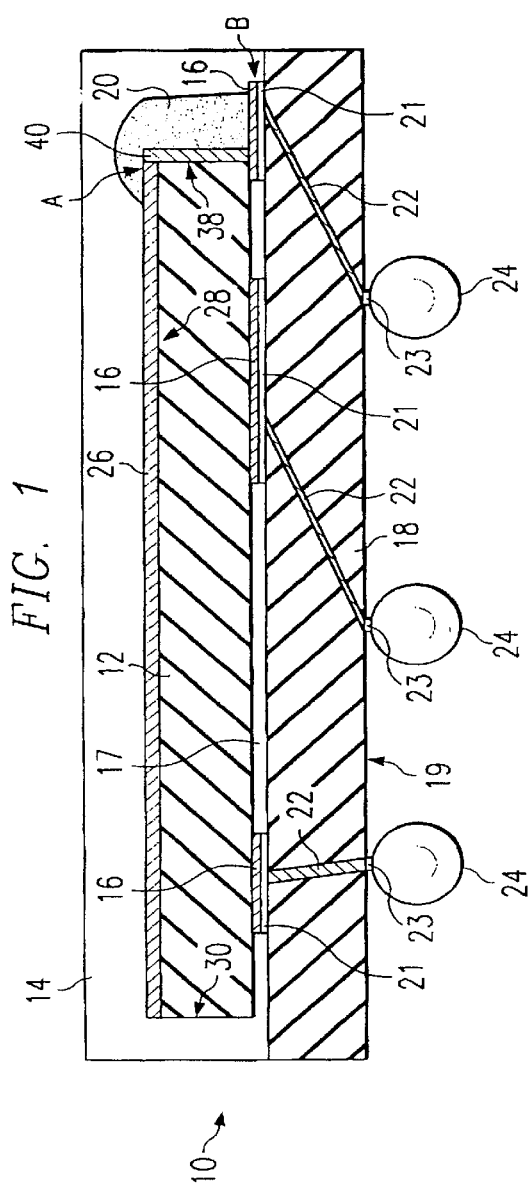
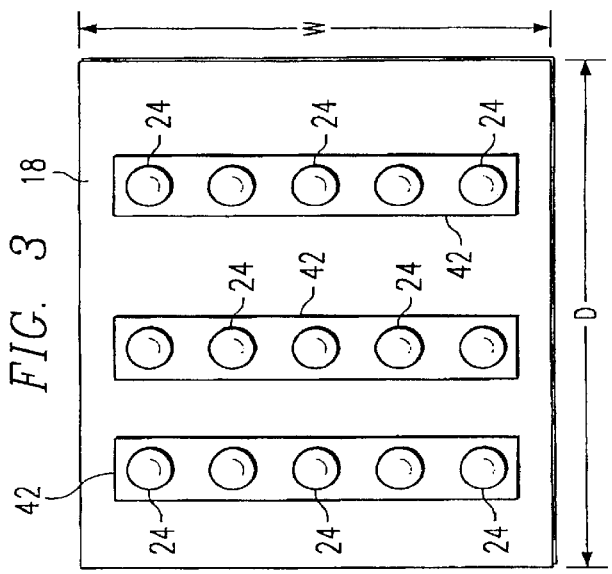
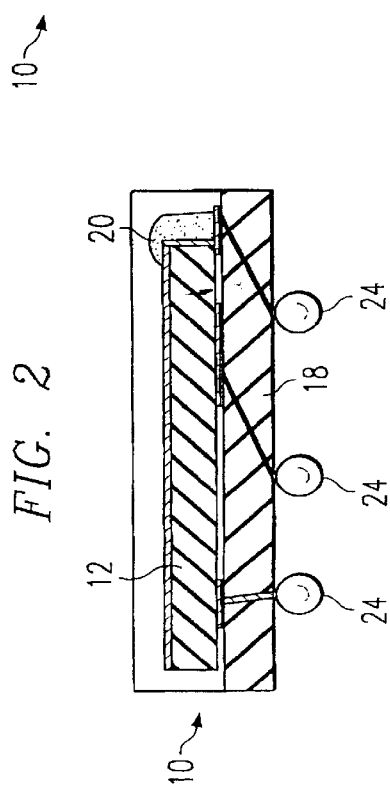

SEMICONDUCTOR AND FLIP CHIP PACKAGES AND METHOD HAVING A BACK-SIDE CONNECTION

This application is a divisional of U.S. application Ser. No. 09/065,677, filed on Apr. 23, 1998, now U.S. Pat. No. 6,191,487 entitled Semiconductor and Flip Chip Packages and Method Having a Back-Side Connection, the entire contents of which are hereby incorporated by reference herein.

TECHNICAL FIELD OF THE INVENTION

The present invention relates generally to electronic and electronic systems and methods, and more particularly, to a method and apparatus for manufacturing and electrically connecting semiconductor chip packages to printed circuit boards using a back side connection.

BACKGROUND OF THE INVENTION

The semiconductor industry has continued to provide products with increased speed and memory while at the same time reducing the overall space requirements of the integrated circuits and electronics associated with these improved products. However, pressure still exists within the industry to reduce the size of circuits and space requirements of the electrical components on the printed circuit boards so that the overall size of the electronic device (such as a cellular telephone) is minimized. The industry has developed a "chip-scale" standard to define minimum space requirements for semiconductor components. A chip-scale circuit is one that has an area equal to or less than 1.2 times the area of the die/used to make the device.

Semiconductor chip manufacturers have typically focused on reductions in size of memory modules and microprocessors. For example, large scale integrated circuits, such as microprocessors are typically tab-leaded, flip chip bumped or coated onto the printed circuit board. However, the smaller pin count components such as transistors, diodes and FETs are still connected using lead frame technology to the printed circuit board. The reduction in size of these smaller pin count semiconductor chips to chip-scale dimensions or near chip scale dimensions would further decrease the overall size of semiconductor circuit boards.

Various methods have been used to accomplish reductions in size, including "flip-chip" technologies. In a flip chip devise, the flip chip bonding is a technique of using solder balls to solder the chips face down on a substrate. An example of flip chip bump bonding is shown in U.S. Pat. No. 4,912,545.

A conductive epoxy has also been used to making a front-side connection from multiple die to a substrate. An example of this can be seen in U.S. Pat. No. 5,657,206 where the connection is made from the die front Oside to the substrate.

SUMMARY OF THE INVENTION

The present invention provides a semiconductor chip package with a back side connection and method of manufacture that substantially eliminates or reduces disadvantages and problems associated with previously developed semiconductor chip packages and methods of manufacture.

More specifically, the present invention provides a semiconductor chip package having a back side connection. The semiconductor chip package includes a die with bond pads to connect to a substrate. The substrate includes terminals opposite the side facing the die that electrically connect to contact pads on the opposite side of the substrate by way of vias that electrically connect the contact pads to the terminals. In one embodiment, the vias can be buried in the substrate. The back side of the die is electrically connected to a bond pad (and thereby to the terminal through the via) using a conductive substance that can cascade from the back side of the die to the bond pad. Solder balls can be attached to the terminals to provide solder connections to a printed circuit board. An insulating coating can be applied to the die between the conductive substance and the edge of the die along which the conductive substance cascades.

In an alternative embodiment, the substrate is eliminated and the conductive substance will make a connection from the die back side directly to the printed circuit board at an etch or pad.

The present invention provides a technical advantage by reducing the area required for discreet devises and integrated circuits formed from standard die having back side connections. The present invention eliminates the requirement for lead wires extending from the die in a flip chip package to the printed circuit board, thereby reducing the space required to connect the flip chip device to the remainder of the circuit.

The present invention provides another technical advantage by allowing the use of standard back side connection die. The present invention can use the existing bond pads and industry standard die without modification of the die.

BRIEF DESCRIPTION OF THE DRAWINGS

For a more complete understanding of the present invention and the advantages thereof, reference is now made to the following description taken in conjunction with the accompanying drawings in which like reference numerals indicate like features and wherein:

FIG. 1 shows a side view of an embodiment of the present invention;

FIG. 2 shows another side view of a particular embodiment of the present invention with exemplary dimensions; and FIG. 3 shows a bottom view of the FIG. 2 embodiment of the present invention with exemplary dimensions;

DETAILED DESCRIPTION OF THE INVENTION

Figure 4:
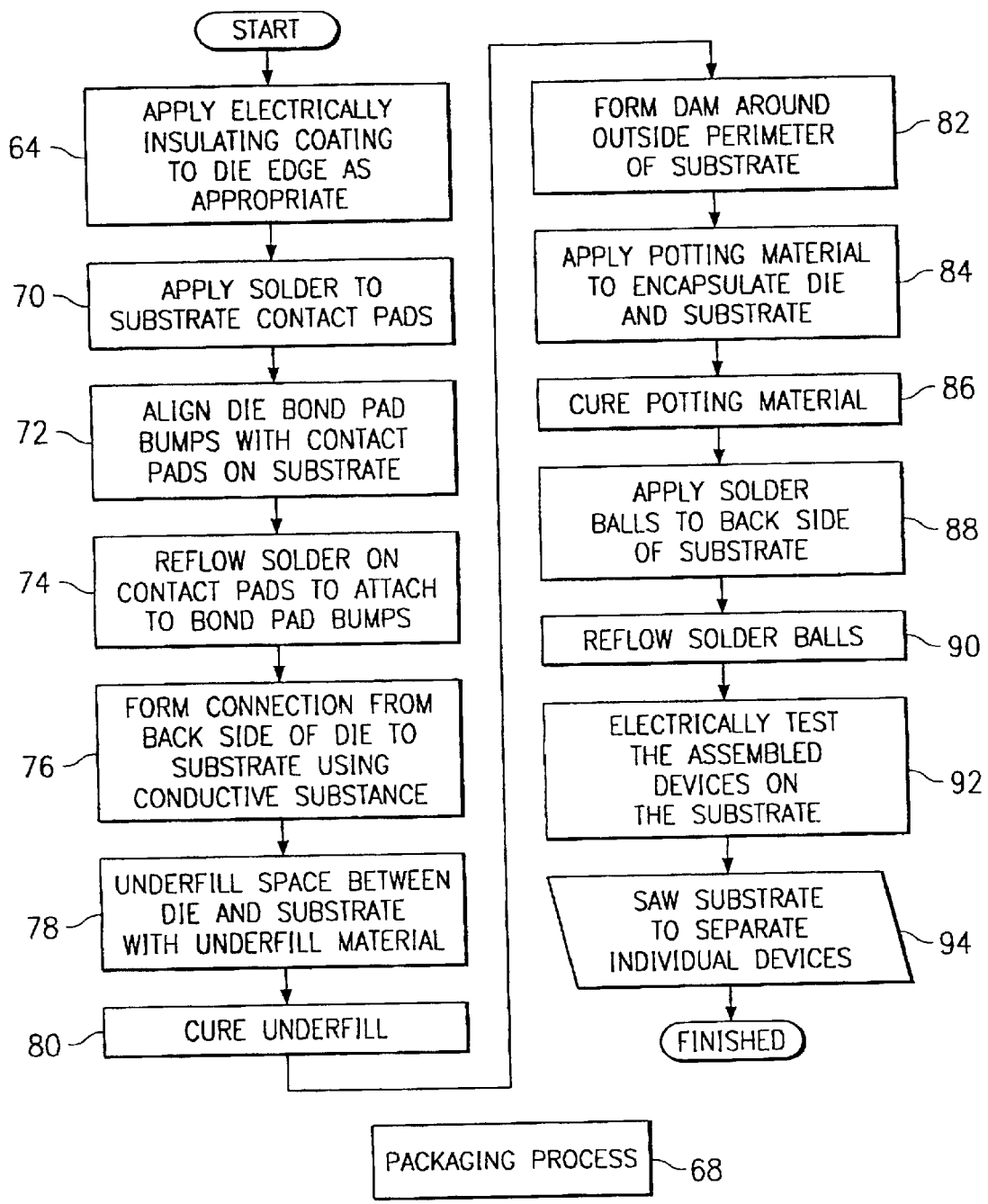
FIG. 4 shows several embodiments of the present invention contained on a larger substrate with the sacrificial layer prior to sawing.

Preferred embodiments of the present invention are illustrated in the FIGUREs, like numerals being used to refer to like and corresponding parts of the various drawings.

The semiconductor chip package of the present invention uses a conductive substance or material to electrically connect the backside of an upside down die to either the solder ball connections of a flip-chip package or directly to a printed circuit board. The present invention can combine flip-chip bump technology with a conductive substance/material that electrically connects the die backside to the solder balls in order to utilize industry standard die with back-side connection points to reduce the size of the components while continuing to use standard "off-the-shelf" die. For the purposes of this disclosure, the term "die" will collectively refer to "die", "chips", "devices", "packages"

and/or "dice" or any other term used to refer to the die or device, whether in wafer form or otherwise.

FIG. 1 shows an embodiment of the semiconductor chip package 10 of the present invention that is a flip-chip package 10 including an upside down die 12 having an active back side. The upside down die 12 is inverted so that the die 12 front side faces the internal side 17 of substrate 18. The upside down die 12 includes any industry standard die with an active back side that can be the die for any discreet component or integrated circuit. The upside down die 12 typically includes a metallization layer 26 on the back side 28 of the upside down die 12. The die 12 can be provided by a manufacturer with the flip chip bump technology (bond pads 16) included, or the bond pads 16 can be subsequently added to the die 12. It should be understood that any discrete component or integrated circuit, including but not limited to diodes, transistors, and microprocessors, can be contained within the flip-chip package 10 of the present invention.

The upside down die 12 bonds to contact pads 21 of substrate 18 through the metal bond pads 16 provided with the die 12. The number of metal bond pads 16 will depend on the particular die 12 and application. The metal bond pads 16 are typically copper or nickel pads having a gold plating (or other appropriate plating). The substrate 18 can be a fiberglass, ceramic, or other appropriate material. The substrate 18 can have any height that meets the requirements of the application. However, the substrate 18 should be of an adequate thickness/strength to avoid excessive warping during manufacture. A frame support can be used to avoid excessive warping of the substrate. A potting material 14, such as Dexter Hysol potting compound, surrounds the upside down die 12. The potting material 14 can contain a variety of materials/substances, such as carbon flakes or other thermally conductive substance, that could enhance heat transfer from the flip chip package 10 during electrical operation. The potting material 14 can also be made up of more than one substance, for instance an underfill substance can be used to fill between the upside down die 12 and the substrate 18, while a different potting material can be used to cover the remainder of the upside down die 12.

The substrate 18 includes at least one via 22 for providing electrical connection from the external side 19 to the internal side 17 of the substrate 18. As shown in the embodiment of FIG. 1, a number of vias 22 can be buried in the substrate 18 that continue through the substrate 18. It should be understood that the via can be any means of connecting the substrate internal side 17 to the substrate external side 19, including clip-on lead technology. The buried vias 22 of FIG. 1 originate at a terminal 23 on the external side 19 of the substrate 18 and terminate at a contact pad 21 on the internal side 17 of the substrate 18. Contact pads 21 mate with and electrically connect to bond pads 16 of the upside down die 12. The terminals 23 can include the plated terminal connected to solder balls 24 as shown in FIG. 1. In addition to providing an electrical path from the bond pads 16 to the terminals 23 (or solder balls 24), the buried vias 22 can also provide thermal transfer from the devise (or upside down die 12) to the substrate 18 during operation of the semiconductor chip package 10. The solder balls 24 can be used to connect the flip-chip package 10 to a printed circuit board that will incorporate the flip-chip package 10.

A conductive substance 20 is shown electrically connecting the active back side 28 of the upside down die 12 to one of the bond pads 16 connected to the substrate 18. The conductive substance 20 can be any conductive epoxy (for example, a thermo-electrically conductive epoxy manufactured by Epotech) or conductive plastic such as a nitride filled thermo-plastic. The conductive substance 20 may also be a thermally conductive substance to aid in the removal of heat from the device during operation. It should be understood that while the conductive substance 20 must be able to conduct electrically, it need not necessarily require thermal conductivity depending on the thermal transfer requirements of the particular flip-chip device 10.

As shown in the FIG. 1 embodiment, the conductive substance 20 connects the back side 28 of the upside down die 12 at point A, along the right edge of the upside down die 12, to bond pad 16 at point B at the substrate 18. The conductive substance 20 is shown cascading from the active back side 28 along the die edge 38 to the bond pad 16. The conductive substance 20 makes at least one connection at the back side 28 of the upside down die 12 and connects to at least one bond pad 16 at the substrate 18. The conductive substance 20 can be placed at any point on the die back side 28 and along any die edge 40 to electrically connect the devise 12 to the substrate 18. For example, the conductive substance 20 could be applied to both the right die edge 38 and left die edge 30 in the FIG. 1 embodiment to increase the amount of back side 28 connection. As a further example, in a high-current flip-chip transducer for example, the conductive substance 20 may need to be applied to all four edges of the upside down die 12 in order to significantly increase the amount of back side 28 connection. Furthermore, the conductive substance 20 could be applied multiple times from the back side 28 to the substrate to form multiple conductive substance traces that provide back-side to substrate electrical connections. The amount of conductive substance 20 used will be based on the electrical conductivity requirements of the particular flip-chip package 10. This back-side connection of the upside down die 12 to the solder balls 24 via the thermo-electrically conductive substance 20 provides the ability to greatly reduce the size requirements for semiconductor devices while using standard back side connection die without having to modify the die.

In an alternative embodiment, the semiconductor chip package of FIG. 1 can be a chip-on-board device that does not include a substrate. In this alternative embodiment, the conductive substance 20 would directly connect the die back side 28 to a printed circuit board connection point, such as an etch. This chip-on-board embodiment would provide the advantages of using standard active back side die that are connected using the conductive substance to eliminate the need for lead wire connections, but would further reduce the overall size of the semiconductor package by eliminating the substrate.

In another alternative embodiment, the semiconductor chip package of FIG. 1 can include a die-edge coating 40 as an insulator between the conductive substance 20 and the upside down die 12. This die-edge coating 40 would provide an insulating barrier that would prevent or greatly reduce electrical leakage between the upside down die 12 and the conductive substance 20. The die-edge coating 40 simply needs to be a material that is electrically insulating that is compatible with the semiconductor process (an example of a die-edge coating 40 that can be used in conjunction with the present invention include Chip Seal manufactured by Dow Corning). The die-edge coating can be applied using a dip process. The individual die 12 can be dipped into a container of the die edge coating at an angle so that the die edge that the conductive substance will cascade down is covered. The coating process should leave the die-edge coating on the die (other than the back side) where the conductive would otherwise make contact with the die absent the die edge coating. The die-edge coating 40 can be applied to the die as needed for the particular flip chip package 10 application so that the die-edge coating 40 is between the die edge 38 and the conductive substance 20.

FIGS. 2 and 3 show a side and bottom view respectively of a specific embodiment of the flip chip package 10 of the present invention that is a flip chip transistor with exemplary dimensions. The resistivity of the upside down die 12 in the flip chip transistor of FIG. 2 can be, as an example, approximately 800 volts. It should be understood that the die resistivity can vary for different component flip chip packages 10 of the present invention and for different flip chip applications. In FIG. 2, the upside down die 12 (plus bond pads 16) height is 0.0190 inches, the substrate height is 0.0080 inches, and the flip chip package height exclusive of the solder balls 24 is 0.0320 inches. The entire flip chip package height is approximately 0.0510 inches. The height of various embodiments of the flip chip package 10 depend on the die height, plus the substrate height, plus the solder ball/terminal height, plus the potting height required in order to cover the conductive substance and die back side. Minimizing each of these heights will minimize the height of the overall flip chip package 10.

As shown in FIG. 3, the flip chip package 10 has width W and a depth D. The area of the flip chip package is defined as the width W multiplied by the depth D. For the particular flip chip transistor 10 of FIG. 2, the flip chip package 10 has a width of 0.1520 inches by a depth of 0.1950 inches, while the upside down die 12 has a width of 0.1440 inches and a depth of 0.178 inches. It should be understood that these dimensions are exemplary and are not limitations on the size of the flip-chip package of the present invention. The minimum flip-chip package width and depth dimensions are somewhat dependent on the width and depth dimensions of the upside down die used in the flip chip package. The flip-chip package width and depth dimensions can be equal to the die width plus approximately 4 to 10 mils and the die depth plus approximately 4 to 10 mils, respectively. The approximately 4 to 10 mils of additional width and depth for the entire flip chip package 10 provide the additional space necessary to allow for the conductive substance 20 that goes from the upside down die back side to the bond pad 16 on the substrate 18. It should be understood that the present invention is not limited to 4 to 10 mils of extra width and depth above and beyond the die width and depth for the flip chip package. Advances in technology could reduce both 1) the die width and depth and 2) the amount of excess width and depth beyond the die width and depth to allow for the conductive substance 20 and the potting material 14. The only limitation on the minimum flip-chip package area is the area of the die 12 plus enough distance outside the die to allow the back side connection to the substrate.

The flip chip 10 area is defined as the flip chip width times the flip chip depth. The die area is the die width times the die depth. It is a technical advantage of the present invention that the flip-chip package size can meet the "chip-scale" sizing standards in the industry. Current chip-scale standard packaging is defined as 1.2 times the die area. For the embodiment in FIG. 3, the die area is the die width=0.1440 times the die depth=0.1780 for a die area of 0.025632 in$^2$. The overall flip chip transistor area is 0.02964 in$^2$ (0.1520 in.×0.1950 in.) which is equal to 1.16 times the area of the die. Thus, the flip chip transistor 10 of FIG. 3 meets chip scale requirements. It should be understood that while the present invention provides the technical advantage of allowing flip chips that meet chip scale requirements, the present invention is not just limited to chip scale sized parts.

The flip chip transistor 10 of FIG. 3 shows three conductors 42 with five solder balls 24 per conductor. The vias 22 of FIG. 3 can be either filled or plated with tungsten to increase the thermal cooling capacity of the flip chip transistor 10. The number of solder balls 24 contained on a flip chip package 10 of the FIG. 3 embodiment of present invention is limited to a number such that the center to center spacing between the solder balls 24 is 0.032 inches when using 0.012 inch solder balls 24. This limitation varies for different diameter solder balls and is a well understood limitation in the industry. The flip chip transistor embodiment of FIGS. 2 and 3 can reduce the printed circuit board area required for transistors by 25–30% over existing transistors for every transistor on the printed circuit board.

In operation, the upside down die 12 electrically connects from the die back side 28 via the conductive substance 20 to the bond pad 16 through via 22 to solder ball 24. The solder balls 24 can be connected to a printed circuit board to integrate the flip chip package 10 into the remainder of a circuit. The use of the conductive substance 20 enables a back side 28 connection from the back side of a standard die to the bond pad 16, and thus, through the remainder of the flip chip package 10 to the printed circuit board.

FIG. 4 is a flow diagram illustrating one embodiment of the manufacturing process of the present invention that can be illustrated with reference to FIGS. 4 and 5. The wafer 52 can be a standard wafer containing multiple die and bond pads. This standard wafer with the back side conductive die and bump bond pads can be provided by a manufacturer of the wafer or, alternatively, the bond pads can be added using standard flip chip bumping technologies. "Wafer bumping" is a well-known process in the industry. The die will have a metallization layer 26 on the die back side. Typically, the wafer 52 is made of silicon, but alternative materials, such as gallium arsenide, can also be used.

Referring to FIG. 4, the semiconductor chip package processing 68 begins by applying an electrically insulating die edge coating to any edges of the individual die that will be used to create the back side connection 64. Multiple die can now be attached to a substrate. Similarly to the wafer, the substrate can be provided by a manufacturer and can include contact pads on the back side of the substrate and buried vias connected to solder plated contact pads. The contact pads connect by way of the buried vias to terminals on the opposite side of the substrate that connect to solder balls.

Optionally, additional solder can be screen printed onto the solder pads on the substrate 70. The die are placed on the substrate in an inverted manner so that the bond pad bumps on the die align with the contact pads on the substrate 72. This placement of the upside down die on the substrate is an automated process using standard semiconductor manufacturing equipment. The solder is then re-flowed on the contact pads to connect the contact pads to the bond pad bumps 74.

The back side connection from the back side of the inverted die to a bond pad at the substrate is then formed using the conductive substance, such as an electrically conductive epoxy 76. The space formed between the front side of the die and the substrate is filled with an underfill 78 which is cured 80. The purpose of the underfill is to provide both thermal and physical stress relief for the flip chip package. All of the individual die on the substrate are then covered with a potting material which can be accomplished by damming the perimeter of the substrate 82, applying the potting material within the dam to cover the entire exposed surface of each individual die 84, and curing the potting material 86.

Solder balls are then positioned on the back side of the substrate 88 and re-flowed 90 to connect the solder balls to the substrate, thereby providing an electrically conductive path from the bond pads connected to the front side of the substrate to the solder balls connected to the back side of the substrate through the buried vias. This assumes the solder balls did not come as part of the initial substrate. As an optional step, each of the individual devices, or some subset thereof, can then electrically tested while on the substrate 92. Finally, the substrate is sawed using standard techniques and equipment to separate the individual flip chip devices 94.

In an alternative manufacturing process, the substrate is eliminated and the manufacturing steps include applying the electrically insulating coating 64 and forming a connection from the active back side of the die 76, but in this embodiment the connection would be directly to the printed circuit board instead of to a substrate. If necessary, a potting material and/or underfill can then cover the semiconductor package on the printed circuit board.

Figure 5:
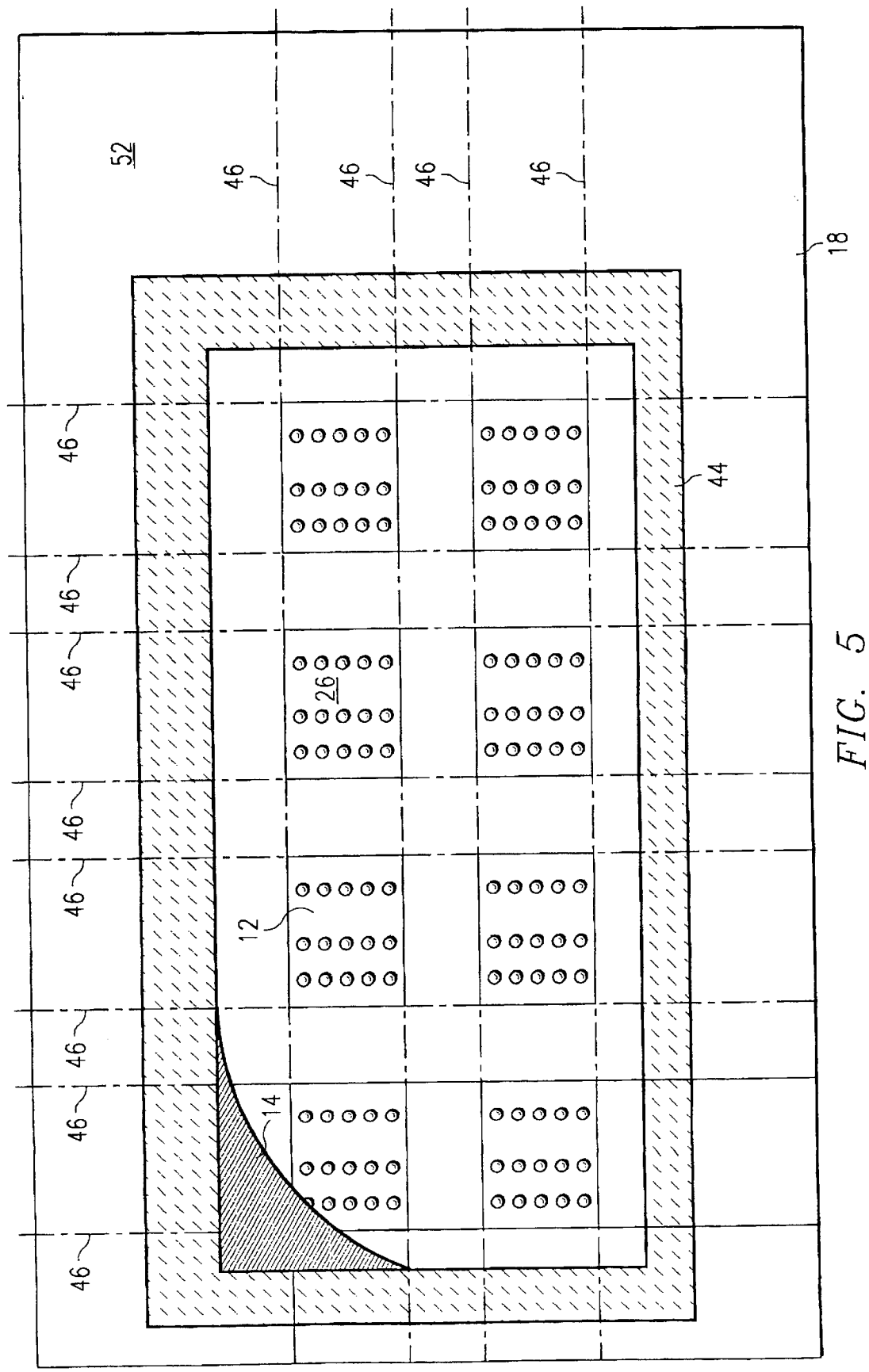
FIG. 5 is a flow diagram illustrating one embodiment of a manufacturing process to manufacture semiconductor chip packages according to the present invention.

FIG. 5 shows a top view of several flip chip packages 10 according to the present invention contained on a larger substrate 18 that aids in illustrating the manufacturing process of the present invention. As shown in FIG. 5, eight upside down die 12 are installed on the substrate 18 with the metallization layer 26 of each die 12 facing the top. While the substrate in FIG. 5 is shown with eight die incorporated onto the substrate, it should be understood that the substrate can be built to incorporate any number of die. FIG. 5 further shows potting ring 44 applied as a perimeter surrounding the upside down die 12 to allow potting material 14 (shown partially) to be applied in order to cover the back side of the multiple die 12 after the back side connection has been established using a conductive substance. After the manufacturing process is completed, the sacrificial portion 42 can be removed and the individual devices separated using standard industry sawing equipment along the saw index lines 46 shown.

Although the present invention has been described in detail, it should be understood that various changes, substitutions and alterations can be made hereto without departing from the spirit and scope of the invention as described by the appended claims.

What is claimed is:

1. A method for manufacturing a semiconductor flip chip package having a back side connection using a die having a active back side, a front side, at least one edge, and at least one bond pad on the front side of the die and a substrate having at least one via, at least one terminal, an at least one contact, each via terminating at a terminal at a first end and at a contact pad at a second end, comprising:
    placing the die on the substrate such that the front side of the die faces the substrate;
    aligning the at least one bond pad with the contact pad;
    placing a conductive substance in contact with both the back side of the die and the at least one bond pad to electrically connect the back side of the die to the terminal on the substrate.

2. The method of claim 1, wherein the via is buried within the substrate.

3. The method of claim 1, further comprising:
    applying an electrically insulating die edge coating to any portion of the die edge that would otherwise come in contact with the conductive substance prior to placing the conductive substance on the die.

4. The method of claim 1, further comprising:
    attaching solder balls to the terminals on the back side of the substrate, thereby providing an electrically conductive path from the bond pads to the solder balls through the vias.

5. The method of claim 1, further comprising:
    prior to placing the conductive substance:
        applying solder to the contact pads of the substrate; and
        re-flowing the solder on the contact pads to connect the contact pads to the bond pads;
    after placing the conductive substance:
        filling the space formed between the front side of the die and the substrate with an underfill;
        curing the underfill; and
        encapsulating the die on the substrate with a potting material.

6. The method of claim 5, wherein encapsulating further comprises:
    damming the perimeter of the substrate;
    applying the potting material within the dam to cover the entire exposed surface of the die; and
    curing the potting material.

7. The method of claim 1, further comprising:
    connecting a plurality of die to the substrate;
    electrically testing each die while on the substrate; and
    sawing the substrate to separate the individual flip chip packages.

8. A method for manufacturing a semiconductor flip chip package comprising a die and a substrate, wherein the die comprises a back side, a front side, an edge between the back side and the front side, and a bond pad on the front side, and wherein the substrate comprises a terminal pad, a contact pad, and a via terminating at the terminal pad at a first end and at the contact pad at a second end, the method comprising:
    placing the die on the substrate such that the front side of the die faces the substrate;
    aligning the bond pad with the contact pad; and
    cascading a conductive substance in contact with the back side of the die and a significant portion of the edge of the die to electrically connect the back side of the die to the terminal pad on the substrate.

9. The method of claim 8, wherein the conductive substance contacts the bond pad.

10. The method of claim 8, wherein the conductive substance comprises a surface that faces the edge of the die, wherein at least a significant portion of the surface is substantially parallel to the edge.

11. The method of claim 8, further comprising:
    prior to cascading the conductive substance:
        applying solder to the contact pad of the substrate; and
        re-flowing the solder on the contact pad to connect the contact pad to the bond pad;
    after cascading the conductive substance:
        filling a space formed between the front side of the die and the substrate with an underfill;
        curing the underfill; and
        encapsulating the die on the substrate with a potting material.

12. The method of claim 8, further comprising:
    connecting a plurality of die to the substrate;
    electrically testing each die while on the substrate; and
    sawing the substrate to separate the individual flip chip packages.

13. The method of claim 8, wherein the conductive substance contacts a substantial portion of the edge of the die.

14. A method for manufacturing a semiconductor chip package comprising a die and a printed circuit board, wherein a die comprises a back side, a front side, an edge between the front side and the back side, and a bond pad on the front side, the die operable to directly connect to a printed circuit board, the method comprising cascading a conductive substance in contact with the back side of the die and the printed circuit board to electrically connect the back side of the die to the printed circuit board, wherein a surface of the conductive substance facing the edge is substantially parallel to the edge.

15. The method of claim 14, further comprising:
   filling a space between the front side of the die and the printed circuit board;
   curing the underfill; and
   encapsulating the die on the printed circuit board.

16. The method of claim 14, wherein the conductive substance contacts the bond pad.

17. The method of claim 14, wherein encapsulating further comprises:
   damming a perimeter of the printed circuit board with a dam;
   applying a potting material within the dam to cover the entire exposed surface of the die; and
   curing the potting material.

18. The method of claim 14, further comprising:
   prior to cascading the conductive substance:
      applying solder to the contact pad of the substrate or to the bond pad; and
      re-flowing the solder to connect the contact pads to the bond pad;
   after cascading the conductive substance:
      filling a space formed between the front side of the die and the substrate with an underfill; and
      curing the underfill.

19. The method of claim 14, further comprising:
   connecting a plurality of die to the printed circuit board;
   electrically testing each die while on the printed circuit board; and
   sawing the printed circuit board to separate the individual flip chip packages.

20. The method of claim 14, wherein the conductive substance contacts substantially all of a vertical direction of the edge for at least a portion of the die.

* * * * *